(12) United States Patent
Wang et al.

(10) Patent No.: US 10,768,743 B2
(45) Date of Patent: Sep. 8, 2020

(54) ELECTRONIC DEVICE AND TERMINAL

(71) Applicant: HUAWEI TECHNOLOGIES CO., LTD., Shenzhen (CN)

(72) Inventors: Dongli Wang, Dongguan (CN); Xiaoyan Yu, Shenzhen (CN); Jiang Liu, Shenzhen (CN); Ziqian Ding, Munich (DE)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 16/314,418

(22) PCT Filed: Jun. 30, 2016

(86) PCT No.: PCT/CN2016/087995
§ 371 (c)(1),
(2) Date: Dec. 30, 2018

(87) PCT Pub. No.: WO2018/000371
PCT Pub. Date: Jan. 4, 2018

(65) Prior Publication Data
US 2019/0171334 A1    Jun. 6, 2019

(51) Int. Cl.
*G06F 3/041* (2006.01)
*G06F 3/045* (2006.01)
(Continued)

(52) U.S. Cl.
CPC .......... *G06F 3/0416* (2013.01); *G06F 1/1626* (2013.01); *G06F 3/041* (2013.01);
(Continued)

(58) Field of Classification Search
CPC ......... G06F 3/0414; G06F 3/045; G06F 3/044
See application file for complete search history.

(56) References Cited

U.S. PATENT DOCUMENTS

2008/0053247 A1  3/2008  Sakurai et al.
2010/0123686 A1  5/2010  Klinghult et al.
(Continued)

FOREIGN PATENT DOCUMENTS

CN       1866007 A    11/2006
CN     102216885 A    10/2011
(Continued)

OTHER PUBLICATIONS

XP055573680 National Instruments Corporation:"Strain Gauge Measurement—A Tutorial",Application Note 078, Aug. 1, 1998, pp. 1-12.
(Continued)

*Primary Examiner* — Nan-Ying Yang
(74) *Attorney, Agent, or Firm* — Kilpatrick Townsend & Stockton LLP

(57) ABSTRACT

An electronic device includes: a foam is located below an OLED display, and a film is located below the foam. Multiple bridge circuits are disposed on the film. Each bridge circuit includes two parallel branches. A first branch includes a first and a third resistor. A second branch includes a second and a fourth resistor. At least one of the four resistors is bonded to the foam. At least one resistor is not bonded to the foam. The resistor that is bonded to the foam is made from a first material. A strain sensitivity coefficient of the first material is greater than 100. A film area in which the resistor that is bonded to the foam is located is covered by a second material. A Young's modulus of the second material is greater than 30.

12 Claims, 13 Drawing Sheets

(51) Int. Cl.
*G06F 1/16* (2006.01)
*H01L 27/32* (2006.01)

(52) U.S. Cl.
CPC .. *H01L 27/323* (2013.01); *G06F 2203/04102* (2013.01); *G06F 2203/04103* (2013.01)

(56) References Cited

U.S. PATENT DOCUMENTS

| | | |
|---|---|---|
| 2011/0141052 A1 | 6/2011 | Bernstein et al. |
| 2013/0141090 A1* | 6/2013 | Sidman .............. G01R 33/0011 324/252 |
| 2014/0125578 A1 | 5/2014 | Zhou |
| 2016/0139717 A1 | 5/2016 | Filiz et al. |
| 2016/0246420 A1 | 8/2016 | Li et al. |
| 2017/0010703 A1* | 1/2017 | Chen ..................... G06F 3/0412 |
| 2019/0049326 A1* | 2/2019 | Li ........................ G01L 9/0054 |

FOREIGN PATENT DOCUMENTS

| | | |
|---|---|---|
| CN | 102629446 A | 8/2012 |
| CN | 204461655 U | 7/2015 |
| CN | 104995587 A | 10/2015 |
| CN | 105094449 A | 11/2015 |
| CN | 204740575 U | 11/2015 |
| CN | 204808289 U | 11/2015 |
| CN | 105224129 A | 1/2016 |
| CN | 205334427 U | 6/2016 |
| JP | 2006003182 A | 1/2006 |
| JP | 2008058106 A | 3/2008 |
| WO | 2015123322 A1 | 8/2015 |

OTHER PUBLICATIONS

XP055573843 Michael B Prime et al:"Residual Stress Measurement by Successive Extension of a Slot: The Crack Compliance Method",Applied Mechanics Reviews, Jan. 1, 1999, total 24 pages.

* cited by examiner (1)

(2)

ELECTRONIC DEVICE AND TERMINAL

CROSS-REFERENCE TO RELATED APPLICATIONS

This application is a national stage of International Application No. PCT/CN2016/087995, filed on Jun. 30, 2016, which is hereby incorporated by reference in its entirety.

TECHNICAL FIELD

The present invention relates to the field of display technologies, and in particular, to a display with a pressure sensor, and a terminal.

BACKGROUND

Currently, a mainstream display (Display) is also referred to as a display panel. There are two main types of displays: a liquid crystal display (Liquid-Crystal Display, LCD) and an organic light-emitting diode (organic light-emitting diode, OLED) display. FIG. 1 is a schematic structural diagram of an LCD display and an OLED display. The LCD display includes a backlight unit (Back Light Unit, BLU) 132, a bottom polarizer 134, a thin-film transistor (Thin-Film Transistor, TFT) glass layer 136, a liquid crystal layer 138, a color filter (Color Filter, CF) 140, and a top polarizer 142. A structure of the OLED display includes a TFT glass substrate 150, an OLED layer 152, a package glass 154, and a polarizer 156.

For a detailed description about the OLED display, refer to a webpage of Wikipedia: https://en.wikipedia.org/wiki/OLED (last access time is Jun. 27, 2016). For a detailed description about the LCD display, refer to a webpage of Wikipedia: https://en.wikipedia.org/wiki/Liquid-crystal display (last access time is Jun. 27, 2016).

Currently, many displays further include a touch control layer, and accordingly, this touchable display is referred to as a touchscreen.

To improve interaction between human and a terminal device such as a mobile phone, a watch, or a wearable device, currently, a pressure sensor is widely applied to parts of the terminal device such as a touchscreen and a housing, so as to identify touch pressure of the user as well as a touch position of the user. Therefore, operation experience with richer content is implemented. A capacitive pressure sensor of Apple company is used as an example. A screen of the mobile phone product iPhone 6s of Apple company is an LCD display. FIG. 2 is a schematic diagram of an iPhone with a pressure (force) sensing function. Herein, 102 is a cover glass (Cover Glass, CG) of the mobile phone, 104 is a display, and 110 is an iron frame of the mobile phone. There is an extremely thin air gap (air gap) between the display 104 and the iron frame 110. A specific structure of the display 104 may be the LCD display structure shown in FIG. 1.

A basic principle of the capacitive pressure sensor of Apple company is as follows: A first electrode 106 is disposed below the display 104, and a second electrode 108 is disposed above a middle frame (not shown in the figure) or the iron frame 110 of the mobile phone. The first electrode 106, the second electrode 108, and the air gap between the first electrode 106 and the second electrode 108 jointly form a capacitor C. An equivalent circuit of the capacitor C is shown in FIG. 3(1). The air gap is used as a dielectric of the capacitor C. When the user presses the screen, because there is the air gap between the display 104 and the iron frame 110, a small deformation is caused to the screen in a pressing direction of the user. As shown in FIG. 3(2), the small deformation causes a change of a capacitance value of the capacitor C, and a variation of the capacitance value is directly proportional to a value of pressure. That is, the variation of the capacitance value may be detected, to detect the value of the pressure. However, the capacitive pressure sensor detects the pressure on the display mainly according to a change of a distance between the dioxides. Therefore, the distance between the dioxides needs to be large enough to ensure accuracy. This increases an overall thickness of the terminal device.

In addition, bottom stacked layers of the OLED display are the TFT and the OLED. The TFT and the OLED are relatively fragile, and have a poor impact resistance capability. Therefore, when the OLED display is applied to the terminal device, a thin foam layer is disposed at the bottom of the OLED display, to mitigate an impact. The foregoing solution of the capacitive pressure sensor is not applicable to the OLED display due to the foam.

SUMMARY

A first aspect of the present invention provides an electronic device, where the electronic device is an OLED display with a pressure sensor. In the present invention, a pressure sensor is added on a basis of an existing display. The electronic device includes an OLED display, foam, and a film. The form is located below the OLED display, and the pressure sensor is located below the foam. The pressure sensor includes the film. Multiple bridge circuits are disposed on the film. Each bridge circuit includes a first branch and a second branch. The first branch is connected in parallel to the second branch. The first branch includes a first resistor and a third resistor, and the second branch includes a second resistor and a fourth resistor. A first end of the first resistor is connected to a first end of the second resistor. A second end of the first resistor is connected to a first end of the third resistor. A second end of the second resistor is connected to a first end of the fourth resistor. A second end of the third resistor is connected to a second end of the fourth resistor. The multiple bridge circuits are located on a same side of the film. At least one resistor in the four resistors is bonded to the foam, and at least one resistor is not bonded to the foam. The resistor that is bonded to the foam is made from a first material. A strain sensitivity coefficient of the first material is greater than 100. A film area in which the resistor that is bonded to the foam is located is covered by a second material, and a film area in which the resistor that is not bonded to the foam is located is not covered by the second material. A Young's modulus of the second material is greater than 30. According to this solution, the display with the pressure sensor is implemented, so as to detect a force imposed by a user on the display.

According to the first aspect, in a first possible implementation of the first aspect, the second resistor and the third resistor are bonded to the foam, and are made from the first material, and the first resistor and the fourth resistor are not bonded to the foam; and film areas in which the second resistor and the third resistor are located are covered by the second material, and film areas in which the first resistor and the fourth resistor are located are not covered by the second material.

According to the first aspect, in a second possible implementation of the first aspect, the second resistor is bonded to the foam, and is made from the first material, and the first resistor, the third resistor, and the fourth resistor are not bonded to the foam; and a film area in which the second resistor is located is covered by the second material, and film areas in which the first resistor, the third resistor, and the fourth resistor are located are not covered by the second material.

The first possible implementation of the first aspect and the second possible implementation of the first aspect are two solutions in which pressure detection can be implemented.

According to any one of the first aspect to the second possible implementation of the first aspect, in a third possible implementation of the first aspect, some film areas near the resistor that is not bonded to the foam are slotted or hollowed out. Because some resistors are not bonded to the foam, and some film areas near the resistors that are not bonded to the foam are slotted or hollowed out, when a force is directly or indirectly imposed on the electronic device, a strain on the resistor that is bonded to the foam is further isolated from a strain on the resistor that is not bonded to the foam.

According to any one of the first aspect to the third possible implementation of the first aspect, in a fourth possible implementation of the first aspect, the film area in which the resistor that is not bonded to the foam is located and a film area near the resistor that is not bonded to the foam are not covered by the second material. It is easier to implement the manner in which the film area is not covered by the second material. In addition, in this manner, a possible strain on a non-bonded resistor can be further reduced.

According to any one of the first aspect to the fourth possible implementation of the first aspect, in a fifth possible implementation of the first aspect, the resistor that is not bonded to the foam is made from the first material. That is, the first resistor, the second resistor, the third resistor, and the fourth resistor are made from the same strain sensitive material, so as to simplify a technological process.

A second aspect of the present invention provides an electronic device, where the electronic device is a display with a pressure sensor. In the present invention, the pressure sensor is added on a basis of an existing display. The display may be an LCE display, or an OLED display. The pressure sensor is located below the display. The pressure sensor includes a film. Multiple bridge circuits are disposed on the film. Each bridge circuit includes a first branch and a second branch. The first branch is connected in parallel to the second branch. The first branch includes a first resistor and a third resistor, and the second branch includes a second resistor and a fourth resistor. A first end of the first resistor is connected to a first end of the second resistor. A second end of the first resistor is connected to a first end of the third resistor. A second end of the second resistor is connected to a first end of the fourth resistor. A second end of the third resistor is connected to a second end of the fourth resistor. The multiple bridge circuits are located on a same side of the film. At least one of the first resistor, the second resistor, the third resistor, or the fourth resistor is bonded to the display, and at least one resistor is not bonded to the display. The resistor that is bonded to the display is made from a first material. A strain sensitivity coefficient of the first material is greater than 100. Some film areas near the resistor that is not bonded to the display are slotted or hollowed out. According to this solution, the display with the pressure sensor is implemented, so as to detect a force imposed by a user on the display.

According to the second aspect, in a first possible implementation of the second aspect, the second resistor and the third resistor are bonded to the display, and are made from the first material, and the first resistor and the fourth resistor are not bonded to the display; and some film areas near the first resistor and the fourth resistor are slotted or hollowed out.

According to the second aspect, in a second possible implementation of the second aspect, the second resistor is bonded to the display, and is made from the first material, and the first resistor, the third resistor, and the fourth resistor are not bonded to the display; and some film areas near the first resistor, the third resistor, and the fourth resistor are slotted or hollowed out.

According to any one of the second aspect to the second possible implementation of the second aspect, in a third possible implementation of the second aspect, a film area in which the resistor that is bonded to the display is located is covered by a second material, and a film area in which the resistor that is not bonded to the display is located is not covered by the second material, where a Young's modulus of the second material is greater than 30. In this solution, a strain on a bonded resistor can be further differentiated from a strain on a non-bonded resistor.

According to the third possible implementation of the second aspect, in a fourth possible implementation of the second aspect, a film area near the resistor that is not bonded to the foam is not covered by the second material. In this solution, a possible strain on a bonded resistor can be further reduced.

According to any one of the second aspect to the fourth possible implementation of the second aspect, in a fifth possible implementation of the second aspect, the resistor that is not bonded to the display is made from the first material. The four resistors are made from the same strain sensitive material, so as to simplify a technological process.

According to any one of the second aspect to the fifth possible implementation of the second aspect, in a sixth possible implementation of the second aspect, the electronic device is a liquid crystal display LCD or an organic light-emitting diode OLED display.

A third aspect of the present invention provides a terminal. The terminal is a terminal with a pressure sensor display. The terminal includes a power supply and the electronic device provided in the first aspect or the second aspect. The power supply supplies power to each bridge circuit in the electronic device. In each bridge circuit, a first end of the power supply is connected to a first end of a first resistor, and a second end of the power supply is connected to a second end of a third resistor. The bridge circuits are connected in parallel to each other. Each bridge circuit can work independently. The terminal can detect a pressure imposed by a user on the display, to implement a pressure detection operation.

Optionally, a resistor that is not bonded to foam is a fixed-value resistor. The fixed-value resistor is not bonded to the foam. Therefore, basically, a strain is not passed to the fixed-value resistor. Alternatively, even if a strain is passed to the fixed-value resistor, a resistance value of the fixed-value resistor does not change. The present invention can still be implemented.

Optionally, the first material is one of the following materials: a carbon-based material, an oxide material, or a semiconductor material. These materials have a relatively large strain sensitivity coefficient each. Therefore, a relatively good effect is achieved by using these materials to make a strain resistor.

Optionally, the second material is copper. Covering copper on a film is a relatively mature technology by using which the present invention can be simply implemented and a good effect can be achieved.

Optionally, the film is a flexible printed circuit FPC or a polyethylene terephthalate PET material.

In this solution, the display with the pressure sensor can be implemented. When the user presses the display, a status of a force imposed by the user on the display can be detected, and a corresponding operation is implemented according to the force status. For example, if it is detected that the force imposed by the user is relatively large, an image displayed on the display may be zoomed in; if it is detected that the force imposed by the user is relatively small, music that is being played may be paused. The electronic device may be a display with a touch function. When detecting a touch operation of the user, the electronic device may further detect a press operation of the user, so as to improve operation experience of the user.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

Figure 1:
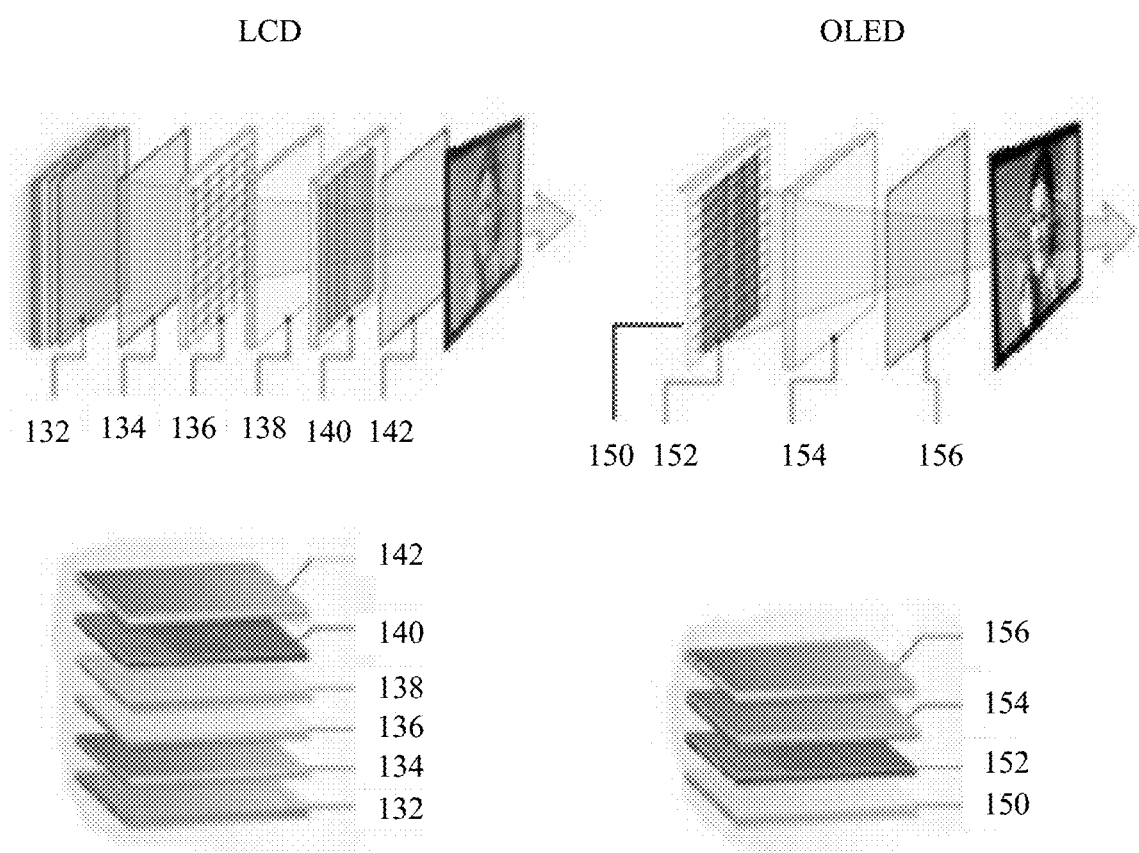
FIG. 1 is a schematic structural diagram of an LCD display and an OLED display.
Figure 2:
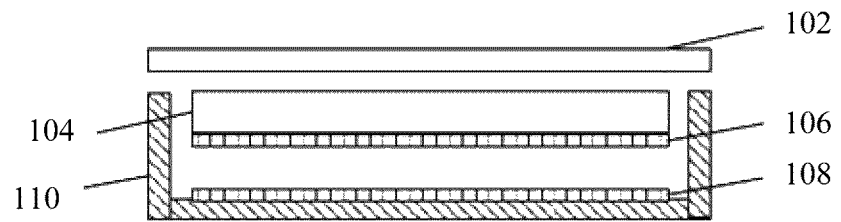
FIG. 2 is a schematic structural diagram of a screen with a pressure sensor implemented in an iPhone.
Figure 3:
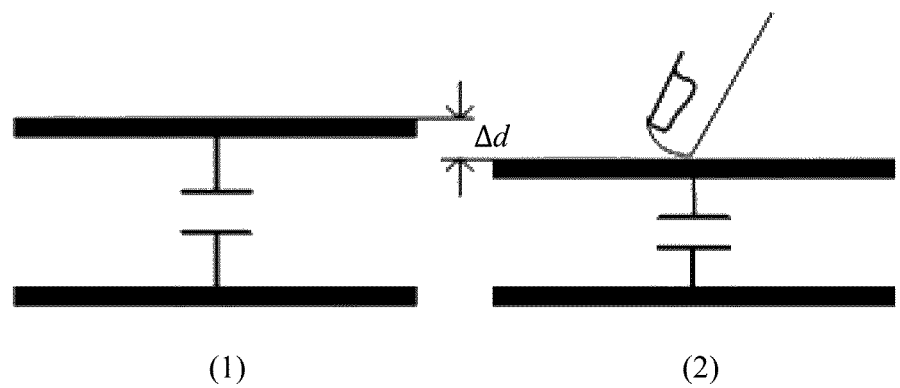
FIG. 3 is a schematic diagram of a principle of a pressure sensor implemented in an iPhone.

To make the objectives, technical solutions, and advantages of the embodiments of the present invention clearer, the following clearly describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present invention.

A terminal mentioned in the present invention may be, for example, a mobile phone, a tablet computer, a computer display, a computer input device (such as a touch control panel, a keyboard, or a mouse), a wearable device, a health monitor device, or a sports auxiliary device.

It should be understood that ordinal numbers such as "first" and "second", if mentioned in the embodiments of the present invention, are only used for distinguishing, unless the ordinal numbers definitely represent a sequence according to the context.

A person skilled in the art easily understands that detailed descriptions about the accompanying drawings provided in this specification are merely for explanation and description and should not be constructed as limitation.

Generally, a touchscreen of the terminal can detect a touch operation performed by a user on the screen. A touchscreen with a pressure sensor can detect a touch event of the user, and further detect a value of a force imposed by the user on the touchscreen. A touch operation with a pressure may be performed on the touchscreen of the terminal, or another surface related to the terminal. The value of the force detected by the pressure sensor by means of measurement may be used as an input signal, input data, or other input information of the terminal. In an example, an input event generated by a large pressure may be different from an input event generated by a small pressure. For example, when detecting that a pressure exceeds a preset threshold, a smartphone may unlock a display by means of an input event generated by the high force (high force); when detecting that a pressure is less than a preset threshold, a smartphone may pause output of voice by means of an input event generated by the low force (low force). Therefore, even if two pressures are imposed on a same position of a same terminal, responses or outputs of the terminal that are corresponding to the two inputs may be different from each other. Further, in an example, a force change may be explained as an input event of an additional type. For example, the user may keep a wearable device with a force sensor close to an artery, to measure a blood pressure and a heart rate of the user. It can be understood that the force sensor may be configured to collect various types of user inputs.

In some embodiments, the pressure sensor may be implemented by using a resistor made from a strain sensitive (strain-sensitive) material that is referred to as a strain resistor in the following. (In mechanics, strain is defined as a deformation generated when a stress is imposed on a tiny material element. Strain may be alternatively referred to as a deformation per unit length. Strain is a dimensionless quantity.) This type of resistor is a resistor whose resistance value changes with a strain. For example, when an external force is directly or indirectly imposed on the resistor, a strain of the resistor changes. Therefore, the resistance value of the resistor may change in response to the strain or the external force. A specific variation of the resistance value of the resistor may be measured by using a bridge circuit (Bridge Circuit).

Figure 4:
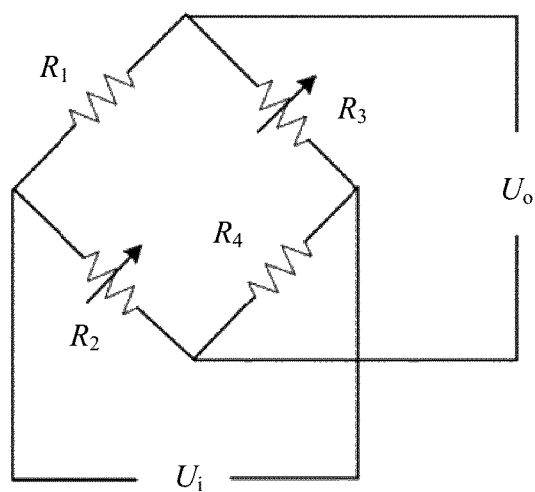
FIG. 4 is a schematic diagram of a full-bridge circuit according to the present invention.

FIG. 4 is a schematic diagram of a bridge circuit. The bridge circuit is a full bridge circuit (Full Bridge Circuit).

The bridge circuit includes two branches with four bridge arms (Bridge Arm or Bridge Leg), and each of R1, R2, R3, and R4 is located on one bridge arm. A first branch includes the resistors R1 and R3, and a second branch includes the resistors R2 and R4. The first branch is connected in parallel to the second branch. The resistors R1 and R3 are connected in series, and the resistors R2 and R4 are connected in series. Herein, Ui is a constant power supply voltage; the resistors R2 and R3 are strain resistors, and are made from a strain sensitive material; the resistors R1 and R4 are fixed-value resistors, that is, a resistance value of R1 and that of R4 basically do not change with a strain; Uo is an output voltage. The strain sensitive material is generally a material with a relatively large strain sensitivity coefficient. The strain sensitivity coefficient (Gauge Factor) is also referred to as a strain coefficient, a strain sensitive coefficient, a strain sensitivity factor, or a strain gauge sensitivity coefficient. For example, the strain sensitive material may be a carbon-based material, an oxide material, or a semiconductor material. Strain sensitivity coefficients of these materials are mostly greater than 100. When a force is directly or indirectly imposed on a resistor made from a material with a relatively large strain sensitivity coefficient, a resistance value change of the resistor is relatively obvious.

The output voltage Uo may be obtained by means of measurement by using a tool such as a multimeter or an oscillometer. In a circuit of an actual terminal product, the output voltage Uo may be directly obtained by means of reading by using a dedicated circuit and a dedicated component.

Likewise, the output voltage Uo may be obtained by means of calculation by using the formula:

$$U_o = \left(\frac{R_2}{R_2 + R_4} - \frac{R_1}{R_1 + R_3}\right)U_i \tag{1}$$

It is assumed that a resistance value of R2 and that of R3 both change by $\Delta R$. The formula (1) may change to:

$$U_o = \left(\frac{R_2 + \Delta R}{R_2 + \Delta R + R_4} - \frac{R_1}{R_1 + R_3 + \Delta R}\right)U_i \tag{2}$$

It is assumed that initial resistance values of the resistors R1, R2, R3, and R4 are all $R_0$. In this case, $$U_o = \left(\frac{\Delta R}{2R_0 + \Delta R}\right)U_i \tag{3}$$

Therefore, a relationship between $U_o$ and $\Delta R$ may be obtained:

$$\frac{\Delta R}{R_0} = \frac{2U_I}{U_i - U_O} \tag{4}$$

Because $U_i$, $U_o$, and $R_0$ are known values or can be obtained by means of measurement, $\Delta R$ can be obtained, that is, variations of resistance values that are caused due to strains on the resistors R2 and R3.

Because R2 and R3 are made from the strain sensitive material, the following relationship generally exists:

$\Delta R/R_0 = S*\varepsilon$

Herein, S is a strain sensitivity coefficient (Gauge Factor) that is also referred to as a strain coefficient, a strain sensitive coefficient, a strain sensitivity factor, or a strain gauge sensitivity coefficient, S of a metal material is generally 1.8 to 3.6, and S of a semiconductor material is generally greater than 100. It can be learned that a sensitivity of the semiconductor material is far higher than that of the metal material. $\varepsilon$ is a strain. The strain $\varepsilon$ is proportional to a force F imposed on the resistor. A larger strain $\varepsilon$ indicates a greater force F imposed on the resistor.

Figure 6:
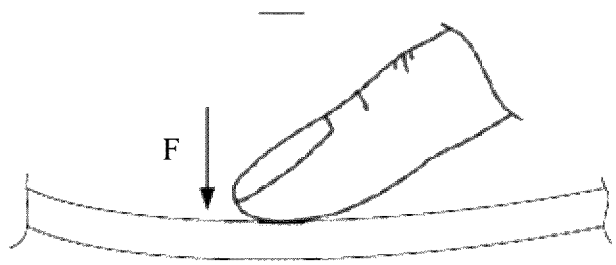
FIG. 6 is a schematic diagram of a relationship between an output voltage Uo and a force F according to the present invention.
Figure 6:
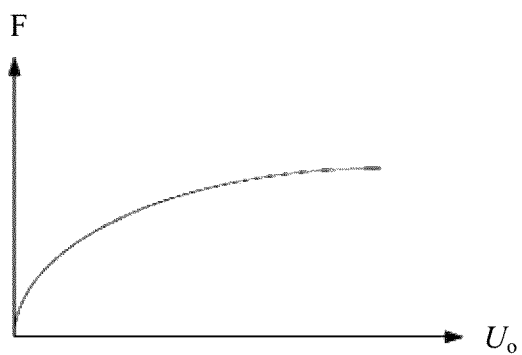

Therefore, as shown in FIG. 6, a value relationship may be established between the output voltage Uo and the force F, to implement the pressure sensor. In FIG. 6(1), a finger of a user presses a display. A deformation is caused to the display. The deformation is passed to a resistor. Therefore, a resistance value of the resistor changes, and original bridge balance is broken. The output voltage Uo changes. FIG. 6(2) roughly shows the relationship between the output voltage Uo and the force F.

In a case of a same strain, a larger strain sensitivity coefficient of a material indicates a larger variation of a resistance value. Therefore, if a resistor is made from a material with a larger strain sensitivity coefficient, when an external force is imposed on the screen, a variation of a resistance value of the resistor is larger, and an obtained measurement result of the external force is more accurate.

Figure 5:
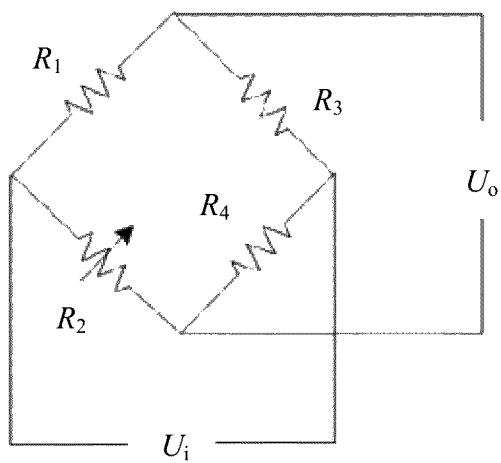
FIG. 5 is a schematic diagram of a half-bridge circuit according to the present invention.

In some embodiments, the bridge circuit includes a half-bridge circuit (Half Bridge Circuit) and a full bridge circuit (Full Bridge Circuit). The circuit shown in FIG. 4 is a full bridge circuit. FIG. 5 is a schematic diagram of a half-bridge circuit. The half-bridge circuit shown in FIG. 5 is also referred to as a Wheatstone bridge (Wheatstone bridge), a Wheatstone bridge, a Wheatstone bridge, or a one-armed bridge. The following can be obtained by means of calculation:

$$U_O = \left(\frac{\Delta R}{4R_0 + 2\Delta R}\right)U_i \tag{5}$$

A relationship between $U_o$ and $\Delta R$ may be calculated by using the formula (5).

In some embodiments, the calculation may be simplified. Generally, $\Delta R \ll R_0$. Therefore, the formula (5) may be simplified to obtain:

$$U_O \approx \left(\frac{\Delta R}{4R_0}\right)U_i \tag{6}$$

Figure 7:
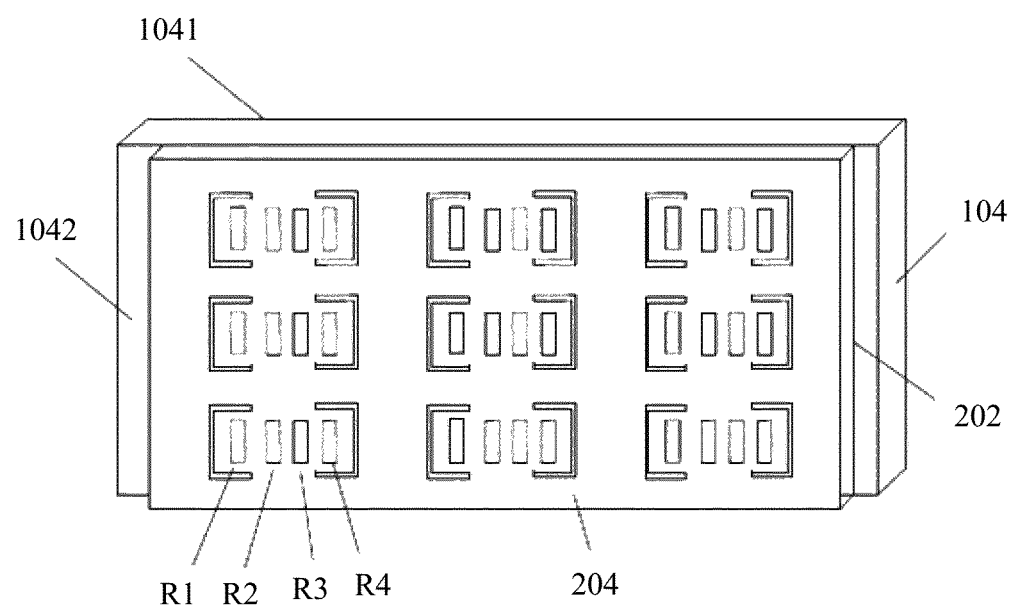
FIG. 7 is an electronic device according to the present invention.

An embodiment of the present invention provides an electronic device. The electronic device is a display with a pressure sensor. FIG. 7 is a schematic structural diagram of a display with a pressure sensor. The display 104 includes a top surface 1041 and a bottom surface 1042. The top surface 1041 and the bottom surface 1042 are two surfaces that are face to face with each other. If the display is an LCD display, the bottom surface 1042 may be a backlight module. If the display is an OLED display, the bottom surface 1042 may be a TFT glass substrate. A thin film 202 is disposed on the bottom surface of the display 104. The thin film 202 may be a flexible printed circuit (Flexible Printed Circuit, FPC), a polyethylene terephthalate (Polyethylene Terephthalate, PET) material, or the like. A bridge array 204 is disposed on the thin film 202. Some areas of the thin film 202 are bonded to the bottom surface 1042, and some areas of the thin film 202 are not bonded to the bottom surface 1042. The bridge array 204 is an array including multiple bridge circuits. Specifically, an optical clear adhesive (Optically Clear Adhesive, OCA) may be used for the bonding. The optical clear adhesive is a transparent adhesive.

Figure 8:
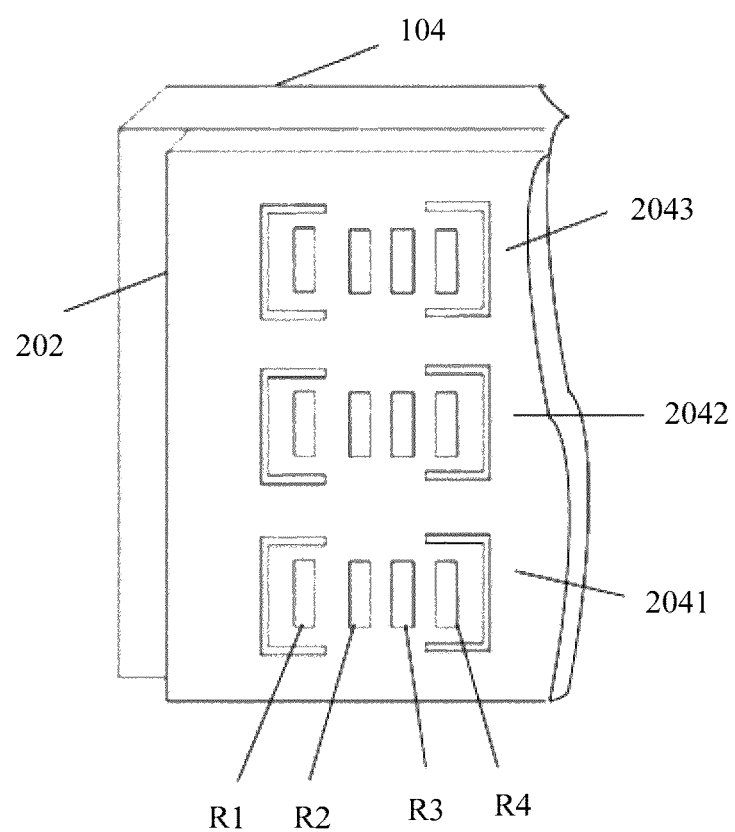
FIG. 8 is a locally enlarged schematic diagram of an electronic device according to the present invention.
Figure 9:
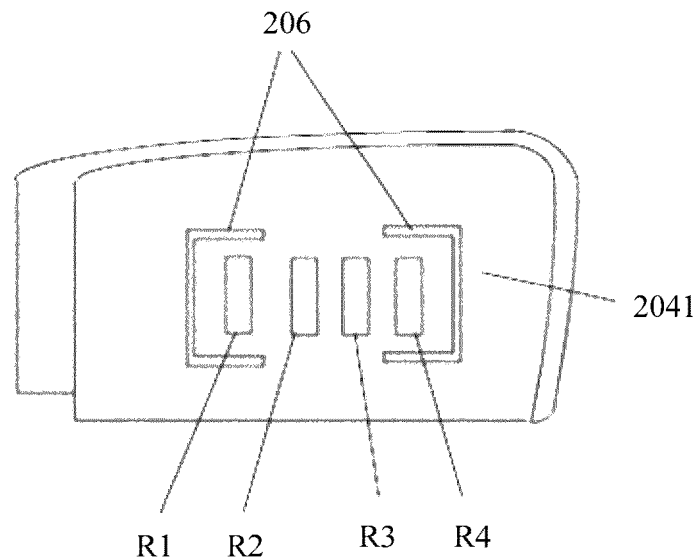
FIG. 9 is another locally enlarged schematic diagram of an electronic device according to the present invention.
Figure 10:
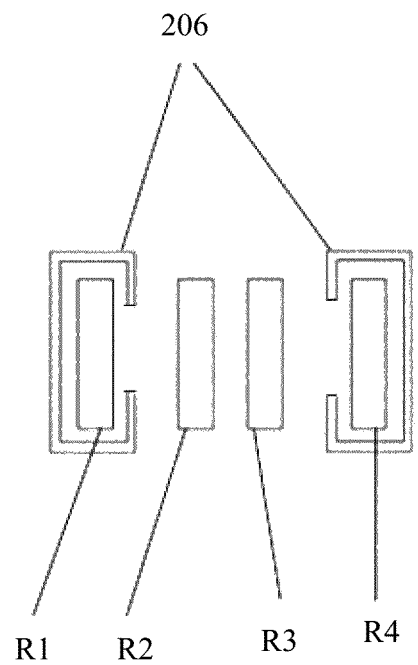
FIG. 10 is a schematic diagram of an implementation for slotting or hollowing out according to the present invention.

To more clearly describe this solution, FIG. 8 is a locally enlarged schematic diagram of FIG. 7. As shown in FIG. 8, 2041 is a first bridge circuit, 2042 is a second bridge circuit, and 2043 is a third bridge circuit. In some embodiments, 2041, 2042, and 2043 may be the bridge circuits shown in FIG. 4. In some other embodiments, 2041, 2042, and 2043 may be the bridge circuits shown in FIG. 5. It may be understood that in some other embodiments, 2041, 2042, and 2043 may be a combination of the bridge circuits shown in FIG. 4 and the bridge circuits shown in FIG. 5. For example, 2041 is the bridge circuit shown in FIG. 4, and 2042 and 2043 are the bridge circuits shown in FIG. 5. Description is given in the following by using an example in which 2041, 2042, and 2043 are the bridge circuits shown in FIG. 4. In an example of the first bridge circuit 2041, a connection manner of resistors R1, R2, R3, and R4 is the same as that of the bridge circuit shown in FIG. 4. Each of the resistors R1, R2, R3, and R4 may be a resistor made from a strain sensitive material. Areas on the thin film 202 in which the resistors R2 and R3 are disposed are bonded to the display 104, and areas on the thin film 202 in which the resistors R1 and R4 are disposed are not bonded to the display 104. Some areas near the resistors R1 and R4 are slotted or hollowed out. When a force is directly or indirectly imposed on the thin film 202, because the areas on the thin film 202 in which the resistors R2 and R3 are disposed are bonded to the display 104, a strain on the thin film 202 is passed to the resistors R2 and R3. Therefore, resistance values of the resistors R2 and R3 change. Because the areas on the thin film 202 in which the resistors R1 and R4 are disposed are not bonded to the display 104, and the areas near the resistors R1 and R4 are slotted or hollowed out, basically, the strain on the thin film 202 is not passed to the resistors R1 and R4. Therefore, basically, resistance values of the resistors R1 and R4 do not change. Likewise, setting of resistors on another bridge circuit is similar to this solution. To more clearly describe this solution, FIG. 9 is a locally enlarged schematic diagram of FIG. 8, and 206 indicates slotted or hollowed-out areas. Some areas near the resistor R1 and some areas near the resistor R4 are slotted or hollowed out. An implementation may be further shown in FIG. 10. Because the resistor is disposed on the thin film, the resistor is bonded to the display. A person skilled in the art may understand that an area on the thin film in which a resistor is disposed is bonded to the display.

In some embodiments, R2 and R3 may be resistors made from materials with a same strain sensitivity coefficient, and R1 and R4 may be fixed-value resistors. Areas on the thin film 202 in which the resistors R2 and R3 are disposed are bonded to the display 104, and areas on the thin film 202 in which the resistors R1 and R4 are disposed are not bonded to the display 104. When a force is directly or indirectly imposed on the thin film 202, a strain on the thin film is passed to the resistors R1, R2, R3, and R4. Resistance values of the resistors R2 and R3 change with the strain, and resistance values of the resistors R1 and R4 do not change with the strain because the resistors R1 and R4 are fixed-value resistors. In some other embodiments, further, some areas near the resistors R1 and R4 are slotted or hollowed out. Likewise, in another bridge circuit, an area on the thin film in which a resistor made from a strain sensitive material is disposed is bonded to the bottom surface of the display module, and an area on the thin film in which a fixed-value resistor is disposed is not bonded to the display module. Further, some areas near the fixed-value resistor may be slotted or hollowed out.

Figure 11:
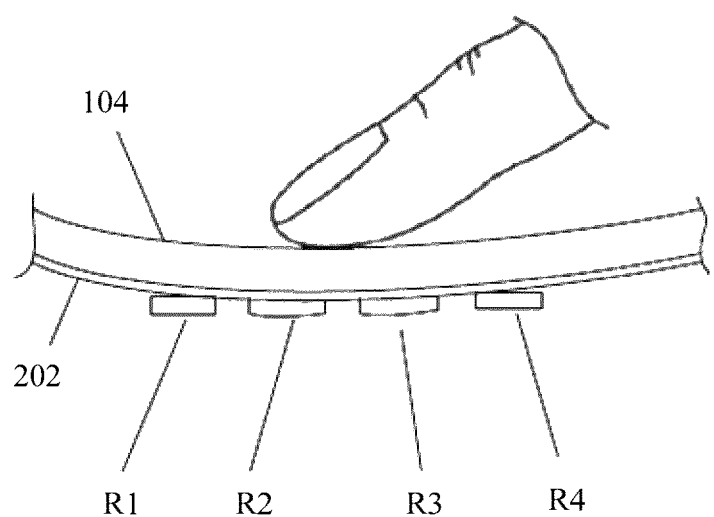
FIG. 11 is a schematic diagram of a pressing principle after hollowing out according to the present invention.

As shown in FIG. 11, description is given by using an example in which R1, R2, R3, and R4 are made from a same strain sensitive material. When an external force is imposed on the display 104, for example, a finger of a user presses the display 104, a small deformation is caused to the display 104, and accordingly, a deformation is caused to the thin film 202. Because the resistors R2 and R3 are bonded to the display module, the small deformation may be passed to the resistors R2 and R3. The deformation on the thin film 202 is not passed to the resistors R1 and R4 because the resistors R1 and R4 are not bonded to the display module and some areas near the resistors R1 and R4 are hollowed out. Therefore, resistance values of the resistors R2 and R3 change with a strain, and resistance values of the resistors R1 and R4 basically do not change. According to the foregoing described solution, a relationship between an output voltage Uo and a force F may be obtained, so as to determine a user operation according to the force F. For example, if the force imposed by the user is relatively large, an image viewed by the user may be zoomed in; if the force imposed by the user is relatively small, music that is being played by the user may be paused.

In some embodiments, the thin film may be covered by copper, so that the small deformation on the display can be better passed to the bonded resistor. In this way, a deformation on the resistor bonded to the thin film may be basically the same as the deformation on the display. A front surface or a back surface of the thin film may be covered by copper.

Figure 12:
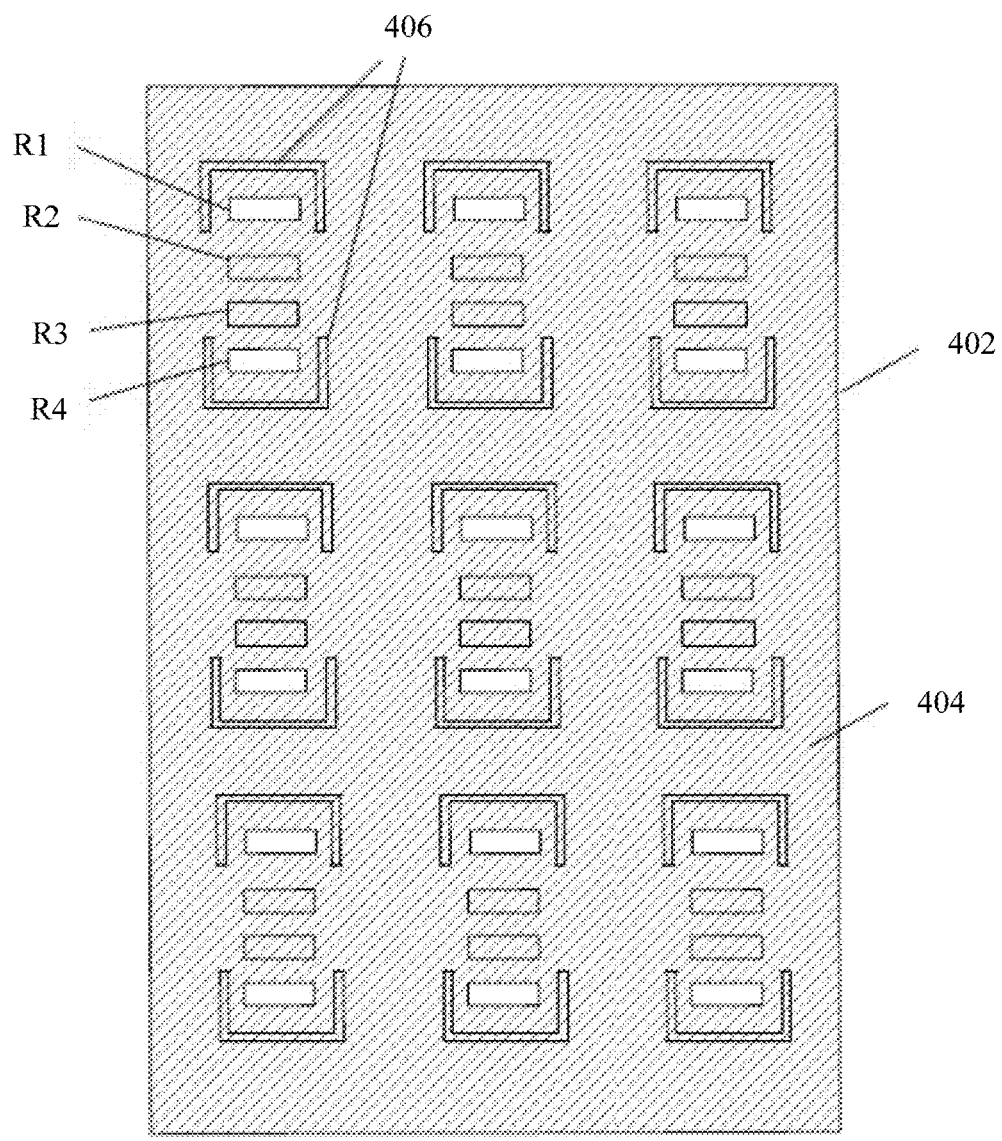
FIG. 12 is another electronic device according to the present invention.

In some embodiments, an area on a thin film 402 in which a non-bonded resistor is disposed is not covered by copper. As shown in FIG. 12, after the thin film 402 is evenly covered by copper 404 (which is shown in a slashed shadow area and does not include a slotted or hollowed out area 406), copper removal is performed on the area on the thin film 402 in which the non-bonded resistor is disposed. For example, copper in film areas in which resistors R1 and R4 are located is removed in a corroding manner or the like. In this way, the area on the thin film 402 in which the non-bonded resistor is disposed is not covered by copper. Resistors R1, R2, R3, and R4 shown in FIG. 12 are resistors included in a bridge circuit. Multiple bridge circuits may be disposed on the thin film 402. The multiple bridge circuits form a bridge array. Setting of another bridge circuit is similar to the setting of the bridge circuit with marks on an upper-left corner of the figure. In this solution, a strain on a resistor bonded to the display can be enhanced, and a possible deformation on a non-bonded resistor may be reduced.

In addition to copper, the thin film may be alternatively covered by a material with a relatively large Young's modulus. Young's modulus is also referred to as Young's modulus (Young's modulus). Covering copper on the thin film is a mature technology and is commonly used, and has a relatively good effect. Table 1 gives Young's moduli of different materials. Generally, a material whose Young's modulus is greater than 30 may be selected.

TABLE 1

Young's moduli of different materials

| Material | Young's modulus (E)/GPa |
| --- | --- |
| Magnesium | 45 |
| Glass | 71.7 |
| Aluminum | 69 |
| Copper | 103-124 |
| Titanium | 105-120 |
| Carbon fiber reinforced plastic | 150 |
| Alloy and steel | 190-210 |

If the thin film is covered by another material with a relatively large Young's modulus, copper removal performed on some areas on the thin film in the following solution may also be understood as removal of the material with the relatively large Young's modulus that covers the thin film. It may be understood that removing copper in a corroding manner or the like is a manner for implementing that a film area in which a non-bonded resistor is located is not covered by copper.

Figure 13:
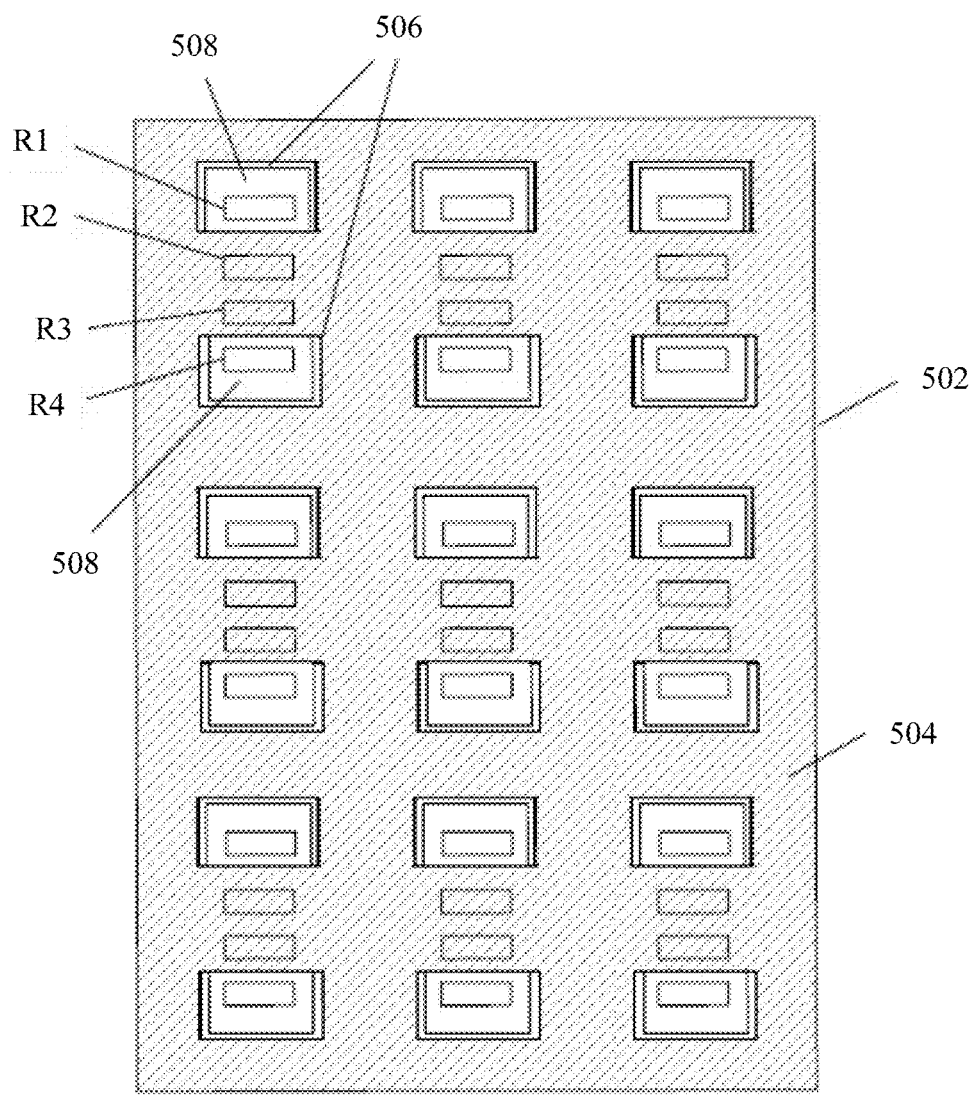
FIG. 13 is a schematic diagram of an implementation for copper removal according to the present invention.

In some other embodiments, as shown in FIG. 13, after a thin film 502 is covered by copper 504 (which is shown in a slashed shadow area), copper removal is performed on areas in which non-bonded resistors R1 and R4 are located and areas near the non-bonded resistors R1 and R4, that is, an area 508 is an area that is not covered by copper, so as to further reduce possible deformations caused to the resistors R1 and R4. Herein, 506 is a slotted or hollowed out area. A slotting or hollowing out manner may be shown in FIG. 10.

In the foregoing embodiment, because of inaccuracy of a manufacturing technology, extremely small deformations may be caused to the non-bonded R1 and R4. In some embodiments, to better isolate strains on R1 and R4 from strains on R2 and R3, an area in which a non-bonded resistor is located and some areas near the non-bonded resistor may be slotted or hollowed out, so that a measurement result of a force is more accurate.

In some other embodiments, resistors in a same bridge circuit may be made from a same strain sensitive material, and may be disposed as close to each other as possible, so that temperatures of the resistors in the same bridge circuit are the same or temperature changes of the resistors in the same bridge circuit are basically the same. For example, as shown in FIG. 12 and FIG. 13, the resistors R1, R2, R3, and R4 are made from a same strain sensitive material, and are disposed on the thin film as close to each other as possible, so as to reduce a temperature difference between the resistors.

If a connection manner of the bridge circuits 2041, 2042, and 2043 is the connection manner shown in FIG. 5, a manner of processing the resistor R2 in FIG. 5 is similar to a manner of processing the resistors R2 and R3 in FIG. 4, and a manner of processing the resistors R1, R3, and R4 in FIG. 5 is similar to a manner of processing the resistors R1 and R4 in FIG. 4.

Figure 14:
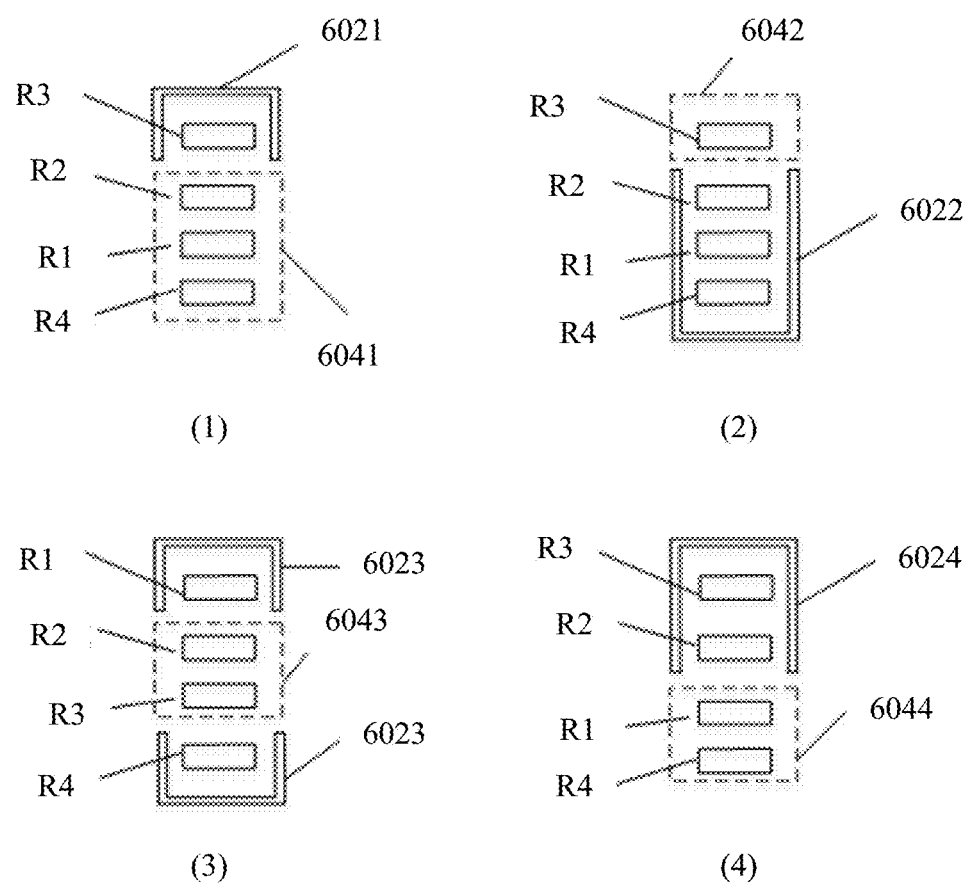
FIG. 14 is a schematic diagram of an implementation for slotting or hollowing out according to the present invention.

A bridge circuit on a thin film may be shown in FIG. 4 or FIG. 5. Correspondingly, a slotting manner may be shown in FIG. 14. A slotting manner of the full bridge circuit in FIG. 4 is shown in FIG. 14(3) and FIG. 14(4). In FIG. 14(3), 6023 indicates a slotted area, and a resistor in the slotted area, for example, the resistor R3, is not bonded to the display; 6043 indicates resistors that are bonded to the display, for example, the resistors R2 and R3. In FIG. 14(4), 6024 indicates a slotted area, and a resistor in the slotted area, for example, the resistor R2 or R3, is not bonded to the display; 6044 indicates resistors that are bonded to the display, for example, the resistors R1 and R4. A slotting manner of the half-bridge circuit shown in FIG. 5 is shown in FIG. 14(2). Herein, 6022 indicates a slotted area, and a resistor in the slotted area, for example, the resistor R1, R2, or R4, is not bonded to the display; 6042 indicates a resistor that is bonded to the display, for example, the resistor R3. In FIG. 14(1), 6021 indicates a slotted area, and a resistor in the slotted area, for example, the resistor R3, is not bonded to the display; 6041 indicates resistors that are bonded to the display, for example, the resistors R1, R2, and R4; this circuit belongs to a full bridge circuit, that is, a circuit with three strain resistors. Resistors that are bonded to the display may be made from materials with basically the same strain sensitive coefficients.

In the foregoing solution, after the resistors are disposed on the thin film and the thin film is covered by copper, a thickness of the thin film is approximately 0.1 millimeters. In this manner for implementing a pressure sensor, it is unnecessary to add a stress bearing board and use the stress bearing board as an additional stress bearing structure, so as to reduce a thickness of the pressure sensor. Because the stress bearing board does not need to be added, material costs and manufacturing costs can be further reduced in a subsequent assembling phase.

Figure 15:
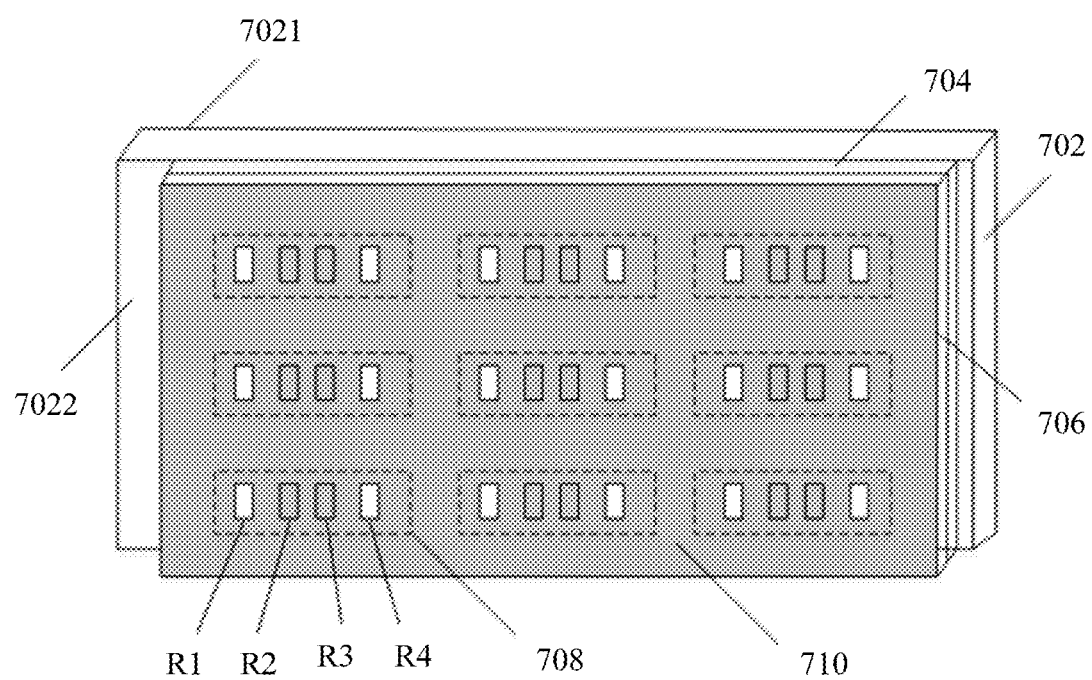
FIG. 15 is another electronic device according to the present invention.

When an OLED display is disposed in a terminal device, generally, foam is added below the OLED display, to protect an organic light-emitting diode of the OLED display. For the solution in which the foam is disposed below the OLED display, a thin film including a bridge array may be disposed below the foam. An embodiment of the present invention provides an electronic device. The electronic device is an OLED display with a pressure sensor. As shown in FIG. 15, the OLED display 702 includes a top surface 7201 and a bottom surface 7022. The bottom surface of the OLED display 702 may be a TFT glass substrate. The top surface 7021 is a surface that is face to face with the bottom surface 7022. Foam 704 is disposed on the bottom surface 7022 of the OLED display 702, to protect an organic light-emitting diode of the OLED display. A thin film 706 is disposed below the foam 704. The thin film may be made from a material such as an FPC or PET. A bridge array is disposed on the thin film 706. Herein, 708 indicates a bridge circuit in the bridge array. A connection manner of each bridge circuit may be shown in FIG. 4 or FIG. 5. Description is given in the following by using an example in which a connection manner of the bridge circuit 708 is the connection manner shown in FIG. 4. Resistors R1, R2, R3, and R4 may be made from a same strain sensitive material, that is, resistance values of the resistors R1, R2, R3, and R4 change with a strain. Some areas of the thin film 706 are bonded to the foam 704, and some areas of the thin film 202 are not bonded to the foam 704. In some embodiments, areas on the thin film in which the resistors R1 and R4 are disposed are not bonded to the foam, and areas on the thin film in which the resistors R2 and R3 are disposed are bonded to the foam. In some other embodiments, areas on the thin film in which the resistors R1 and R4 are disposed are not bonded to the foam, and areas on the thin film in which the resistors R1 and R4 are not disposed are bonded to the foam. The areas in which the resistors R1 and R4 are not disposed may include areas in which the resistors R2 and R3 are disposed and an area in which no resistor is disposed. For example, the thin-film areas in which the resistors R1 and R4 are located are not bonded to the foam 704; and other areas on the thin film 706 are bonded to the foam 704, including the areas in which the resistors R2 and R3 are located. Because the resistor is disposed on the thin film, the resistor is bonded to the foam. A person skilled in the art may understand that an area on the thin film in which a resistor is disposed is bonded to the foam.

In some embodiments, the resistors R2 and R3 are made from a same strain sensitive material, and the resistors R1 and R4 are fixed-value resistors, that is, resistance values of the resistors R1 and R4 do not change with a strain. Some areas of the thin film 706 are bonded to the foam 704, and some areas of the thin film 706 are not bonded to the foam 704. In some embodiments, an area on the thin film in which a fixed-value resistor is disposed is not bonded to the foam, and an area on the thin film in which a resistor made from a strain sensitive material is disposed is bonded to the foam. In some other embodiments, an area on the thin film in which a fixed-value resistor is disposed is not bonded to the foam, and an area on the thin film in which the fixed-value resistor is not disposed is bonded to the foam. The area in which the fixed-value resistor is not disposed may include an area in which a resistor made from a strain sensitive material is disposed and an area in which no resistor is disposed. For example, the thin-film areas in which the resistors R1 and R4 are located are not bonded to the foam 704; and other areas on the thin film 706 are bonded to the foam 704, including the areas in which the resistors R2 and R3 are located.

A front surface or a back surface of the thin film 706 is covered by copper 710 (a shadow area shown in the figure). Copper removal is performed on the areas on the thin film 706 in which the resistors R1 and R4 are disposed. A copper removal manner is basically the same as the manner in the embodiment described in FIG. 12. As shown in FIG. 15, backgrounds of the resistors R1 and R4 are white, and do not belong to the shadow area indicating the copper 710.

In the technical solution shown in FIG. 15, the thin-film areas in which the resistors R2 and R3 are located are covered by copper and are bonded to the foam, and the thin-film areas in which the resistors R1 and R4 are located are not covered by copper and are not bonded to the foam. Therefore, when a force is imposed on the OLED display, a deformation on the OLED display can be passed to the resistors R2 and R3, and basically cannot be passed to the resistors R1 and R4. In this way, strains in different areas on the film are different. Correspondingly, resistance values of resistors in different areas on the film change differently. The force imposed by a user on the OLED display can be detected according to the difference. For example, whether the force F is greater than a threshold is detected, or whether the force F is less than a threshold is detected. The terminal device may perform different operations according to the force.

Figure 16:
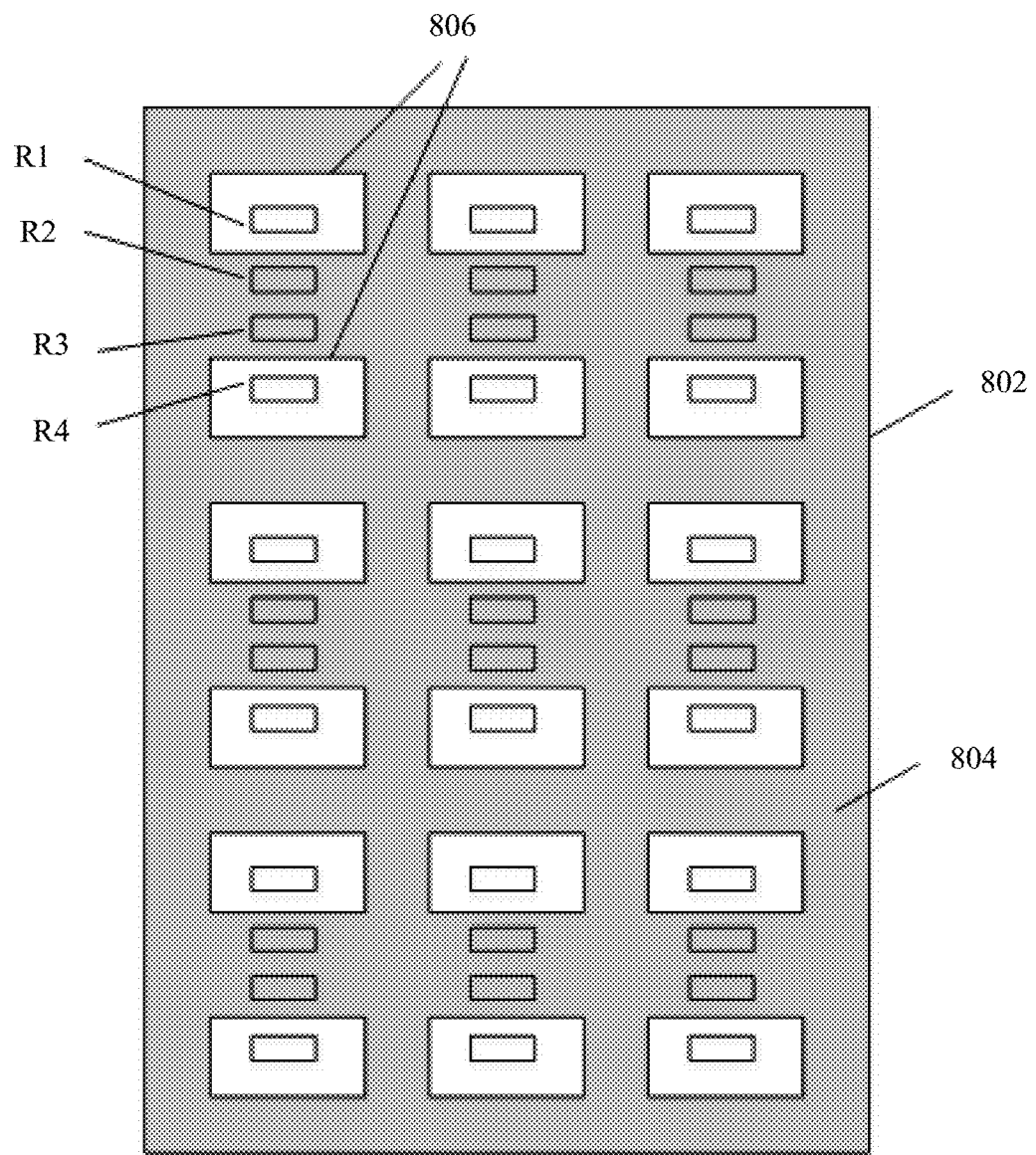
FIG. 16 is a schematic diagram of another implementation for copper removal according to the present invention.

In some embodiments, a copper-removed area is not completely equal to areas that are occupied by the resistors R1 and R4 on the film. As shown in FIG. 16, a thin film 802 is covered by copper 804 (a shadow area shown in the figure), and a copper-removed area includes areas that are occupied by resistors R1 and R4 on the thin film and areas near the resistors R1 and R4. An area 806 is an area that is not covered by copper. In this case, the area 806 may indicate an area that is not bonded to foam.

In some other embodiments, some areas near the resistors R1 and R4 may be slotted or hollowed out. A slotting manner or a hollowing out manner is similar to the solution described in the embodiments of FIG. 7 to FIG. 10. In some other embodiments, for a copper-removed area and a slotted area, an implementation may be shown in FIG. 12 in which copper removal is performed on areas in which resistors R1 and R4 are located and 406 is a slotted or hollowed out area; or may be shown in FIG. 13 in which 508 is a copper-removed area and 506 is a slotted or hollowed out area. The copper-removed areas 508 include areas in which resistors R1 and R4 are located and areas near the resistors R1 and R4.

In some other embodiments, resistors in a same bridge circuit may be made from a same strain sensitive material, and may be disposed as close to each other as possible, so that temperatures of the resistors in the same bridge circuit are the same or temperature changes of the resistors in the same bridge circuit are basically the same. For example, as shown in FIG. 15 and FIG. 16, the resistors R1, R2, R3, and R4 are made from a same strain sensitive material, and are disposed on the thin film as close to each other as possible, so as to reduce a temperature difference between the resistors.

If a connection manner of the bridge circuits 708 is the connection manner shown in FIG. 5, a manner of processing the resistor R2 in FIG. 5 is similar to a manner of processing the resistors R2 and R3 in FIG. 4, and a manner of processing the resistors R1, R3, and R4 in FIG. 5 is similar to a manner of processing the resistors R1 and R4 in FIG. 4.

In the foregoing solution, after the resistors are disposed on the thin film and the thin film is covered by copper, a thickness of the thin film is approximately 0.1 millimeters. In this manner for implementing a pressure sensor, it is unnecessary to add a stress bearing board and use the stress bearing board as an additional stress bearing structure, so as to reduce a thickness of the pressure sensor. Because the stress bearing board does not need to be added, material costs and manufacturing costs can be further reduced in a subsequent assembling phase.

Figure 17:
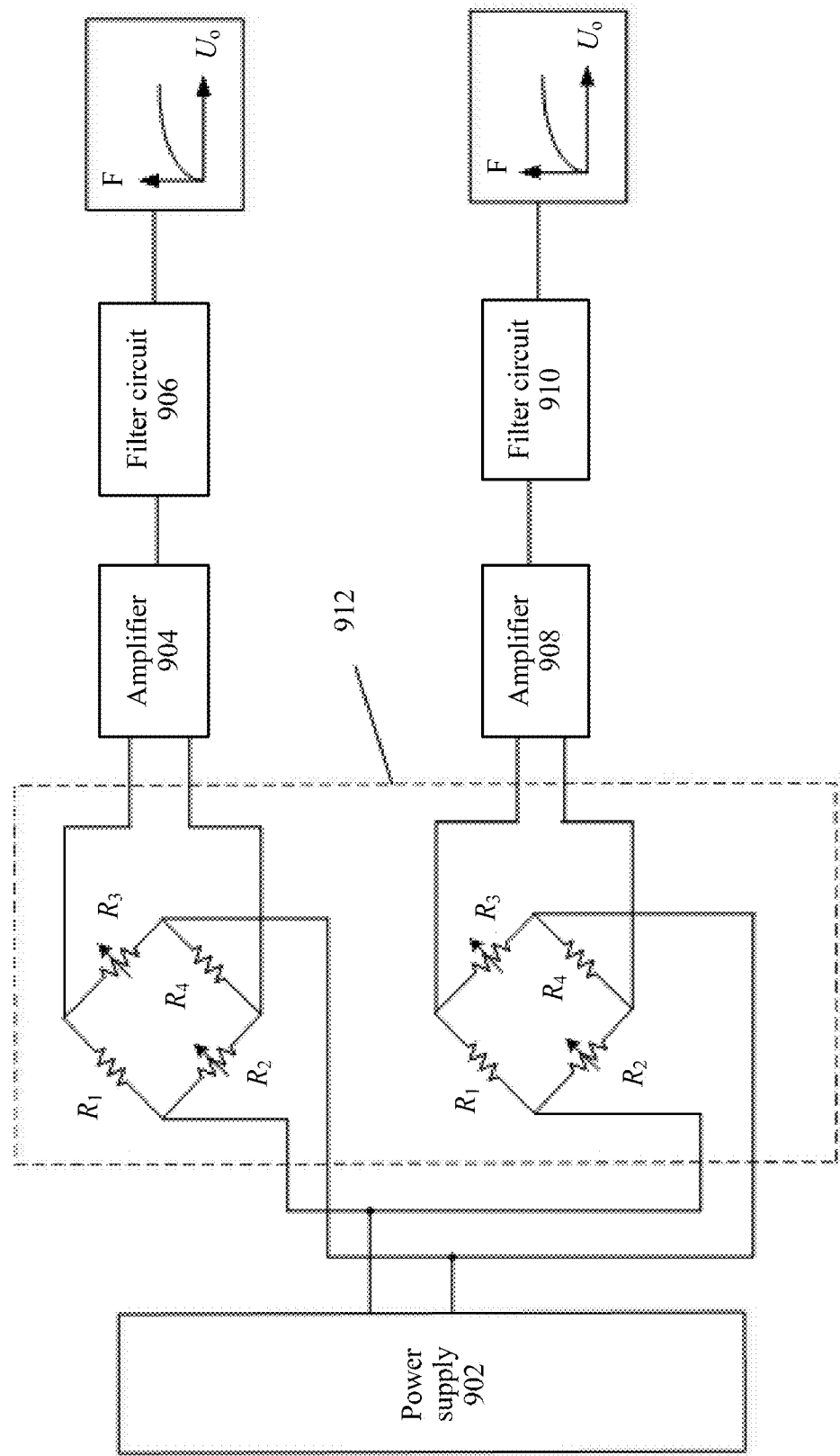
FIG. 17 is a schematic structural diagram of a terminal according to the present invention.

As shown in FIG. 17, an embodiment of the present invention provides a terminal. The terminal includes a display described in an embodiment corresponding to FIG. 7, FIG. 12, FIG. 13, FIG. 15, or FIG. 16. For ease of description, a specific structure of the display is not shown in FIG. 17. Instead, description is given by using 912 to indicate a bridge array of the display. The bridge array includes multiple bridge circuits. Two bridge circuits are used as an example in the figure. A power supply supplies power to the bridge array 912. In an example in which the bridge circuit is connected in the manner in FIG. 4, before a user presses the display by using a finger or a touch control pen, the bridge is in a balanced state, and an output voltage Uo is 0. When the user presses the display by using the finger or the touch control pen, a strain on the display is passed to the resistors R2 and R3. Resistance values of the resistors R2 and R3 change with the strain, and resistance values of the resistors R1 and R4 basically do not change. In this case, the bridge balance is broken, and the output voltage Uo changes and is not 0. Generally, the output voltage Uo of the bridge circuit is relatively small and is hard to obtain by means of direct measurement. Therefore, the output voltage is usually enlarged by using an amplifier; noise is filtered out by using a filter circuit; and then the output voltage is measured. According to the foregoing description in this embodiment, the force imposed by the user on the display may be obtained by means of calculation, so as to determine a user operation according to the force F. For example, if the force imposed by the user is relatively large, an image viewed by the user may be zoomed in; if the force imposed by the user is relatively small, music that is being played by the user may be paused.

In some embodiments, an amplifier 904 and an amplifier 908 may be a same amplifier, and a filter circuit 906 and a filter circuit 910 may be a same filter circuit. This is not limited in the present invention.

It should be noted that the electronic device provided in this embodiment of the present invention may be a display with a pressure sensor. Certainly, the display may further have a touch control function. For example, a touch layer is integrated in an LCD display or an OLED display. For example, the touch layer may be an indium tin oxide (Indium Tin Oxide, ITO) film. In this way, the display is a display that can detect both a touch operation and a press operation of the user.

Finally, it should be noted that the foregoing embodiments are merely intended for describing examples of the technical solutions of the present invention other than limiting the present invention. Although the present invention and benefits of the present invention are described in detail with reference to the foregoing embodiments, persons of ordinary skill in the art should understand that they may still make modifications to the technical solutions described in the foregoing embodiments or make equivalent replacements to some technical features thereof, without departing from the scope of the claims of the present invention.

What is claimed is:

1. An electronic device, wherein the electronic device comprises an organic light-emitting diode OLED display, foam, and a film, wherein
    the foam is located below the OLED display, and the film is located below the foam;
    multiple bridge circuits are disposed on the film, each bridge circuit comprises a first branch and a second branch, and the first branch is connected in parallel to the second branch, wherein the first branch comprises a first resistor and a third resistor, the second branch comprises a second resistor and a fourth resistor, a first end of the first resistor is connected to a first end of the second resistor, a second end of the first resistor is connected to a first end of the third resistor, a second end of the second resistor is connected to a first end of the fourth resistor, and a second end of the third resistor is connected to a second end of the fourth resistor, and the multiple bridge circuits are located on a same side of the film;
    at least one of the first resistor, the second resistor, the third resistor, or the fourth resistor is bonded to the foam, and at least one resistor is not bonded to the foam, wherein the resistor that is bonded to the foam is made from a first material, and a strain sensitivity coefficient of the first material is greater than 100; and
    a film area in which the resistor that is bonded to the foam is located is covered by a deformation transiting material, and a film area in which the resistor that is not bonded to the foam is located is not covered by the deformation transiting material, wherein a Young's modulus of the deformation transiting material is greater than 30.

2. The electronic device according to claim 1, wherein that at least one of the first resistor, the second resistor, the third resistor, or the fourth resistor is bonded to the foam, and at least one resistor is not bonded to the foam, wherein the resistor that is bonded to the foam is made from a first material is specifically:
    the second resistor and the third resistor are bonded to the foam, and are made from the first material, and the first resistor and the fourth resistor are not bonded to the foam; and
    that a film area in which the resistor that is bonded to the foam is located is covered by a deformation transiting material, and a film area in which the resistor that is not bonded to the foam is located is not covered by the deformation transiting material is specifically:
    film areas in which the second resistor and the third resistor are located are covered by the deformation transiting material, and film areas in which the first resistor and the fourth resistor are located are not covered by the deformation transiting material.

3. The electronic device according to claim 1, wherein that at least one of the first resistor, the second resistor, the third resistor, or the fourth resistor is bonded to the foam, and at least one resistor is not bonded to the foam, wherein the resistor that is bonded to the foam is made from a first material is specifically:
    the second resistor is bonded to the foam, and is made from the first material, and the first resistor, the third resistor, and the fourth resistor are not bonded to the foam; and
    that a film area in which the resistor that is bonded to the foam is located is covered by a deformation transiting material, and a film area in which the resistor that is not bonded to the foam is located is not covered by the deformation transiting material is specifically:
    a film area in which the second resistor is located is covered by the deformation transiting material, and film areas in which the first resistor, the third resistor, and the fourth resistor are located are not covered by the deformation transiting material.

4. The electronic device according to claim 1, wherein some film areas near the resistor that is not bonded to the foam are slotted or hollowed out.

5. The electronic device according to claim 1, wherein a film area near the resistor that is not bonded to the foam is not covered by the deformation transiting material.

6. The electronic device according to claim 1, wherein the resistor that is not bonded to the foam is made from the first material.

7. An electronic device, wherein the electronic device comprises a display and a film, wherein
    the film is located below the display;
    multiple bridge circuits are disposed on the film, each bridge circuit comprises a first branch and a second branch, and the first branch is connected in parallel to the second branch, wherein the first branch comprises a first resistor and a third resistor, the second branch comprises a second resistor and a fourth resistor, a first end of the first resistor is connected to a first end of the second resistor, a second end of the first resistor is connected to a first end of the third resistor, a second end of the second resistor is connected to a first end of the fourth resistor, and a second end of the third resistor is connected to a second end of the fourth resistor, and the multiple bridge circuits are located on a same side of the film;
    at least one of the first resistor, the second resistor, the third resistor, or the fourth resistor is bonded to the display, and at least one resistor is not bonded to the display, wherein the resistor that is bonded to the display is made from a first material, and a strain sensitivity coefficient of the first material is greater than 100; and
    some film areas near the resistor that is not boned to the display are slotted or hollowed out,
    wherein a film area in which the resistor that is bonded to the display is located is covered by a deformation transiting material, and a film area in which the resistor that is not bonded to the display is located is not covered by the deformation transiting material, wherein a Young's modulus of the deformation transiting material is greater than 30.

8. The electronic device according to claim 7, wherein that at least one of the first resistor, the second resistor, the third resistor, or the fourth resistor is bonded to the display, and at least one resistor is not bonded to the display, wherein the resistor that is bonded to the display is made from a first material is specifically:
the second resistor and the third resistor are bonded to the display, and are made from the first material, and the first resistor and the fourth resistor are not bonded to the display; and
that some film areas near the resistor that is not boned to the display are slotted or hollowed out is specifically: some film areas near the first resistor and the fourth resistor are slotted or hollowed out.

9. The electronic device according to claim 7, wherein that at least one of the first resistor, the second resistor, the third resistor, or the fourth resistor is bonded to the display, and at least one resistor is not bonded to the display, wherein the resistor that is bonded to the display is made from a first material is specifically:
the second resistor is bonded to the display, and is made from the first material, and the first resistor, the third resistor, and the fourth resistor are not bonded to the display; and
that some film areas near the resistor that is not boned to the display are slotted or hollowed out is specifically: some film areas near the first resistor, the third resistor, and the fourth resistor are slotted or hollowed out.

10. The electronic device according to claim 7, wherein a film area near the resistor that is not bonded to the display is not covered by the deformation transiting material.

11. The electronic device according to claim 7, wherein the resistor that is not bonded to the display is made from the first material.

12. A mobile terminal, wherein the mobile terminal comprises: a power supply, and an electronic device, wherein the electronic device comprises an organic light-emitting diode OLED display, foam, and a film;
the foam is located below the OLED display, and the film is located below the foam;
multiple bridge circuits are disposed on the film, each bridge circuit comprises a first branch and a second branch, and the first branch is connected in parallel to the second branch, wherein the first branch comprises a first resistor and a third resistor, the second branch comprises a second resistor and a fourth resistor, a first end of the first resistor is connected to a first end of the second resistor, a second end of the first resistor is connected to a first end of the third resistor, a second end of the second resistor is connected to a first end of the fourth resistor, and a second end of the third resistor is connected to a second end of the fourth resistor, and the multiple bridge circuits are located on a same side of the film;
at least one of the first resistor, the second resistor, the third resistor, or the fourth resistor is bonded to the foam, and at least one resistor is not bonded to the foam, wherein the resistor that is bonded to the foam is made from a first material, and a strain sensitivity coefficient of the first material is greater than 100; and
a film area in which the resistor that is bonded to the foam is located is covered by a deformation transiting material, and a film area in which the resistor that is not bonded to the foam is located is not covered by the deformation transiting material, wherein a Young's modulus of the deformation transiting material is greater than 30;
wherein the power supply supplies power to the each bridge circuit in the electronic device; and in the each bridge circuit, a first end of the power supply is connected to the first end of the first resistor, and a second end of the power supply is connected to the second end of the third resistor.

* * * * *